US008928355B2

United States Patent
Cui et al.

(10) Patent No.: US 8,928,355 B2
(45) Date of Patent: Jan. 6, 2015

(54) AMPLIFIER BANDWIDTH EXTENSION FOR HIGH-SPEED TRANCEIVERS

(71) Applicant: Broadcom Corporation, Irvine, CA (US)

(72) Inventors: Delong Cui, Tustin, CA (US); Afshin Momtaz, Laguna Hills, CA (US); Jun Cao, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/867,883

(22) Filed: Apr. 22, 2013

(65) Prior Publication Data

US 2013/0229232 A1    Sep. 5, 2013

Related U.S. Application Data

(63) Continuation of application No. 13/166,592, filed on Jun. 22, 2011, now Pat. No. 8,451,058.

(51) Int. Cl.
| | |
|---|---|
| H03K 19/094 | (2006.01) |
| H03F 3/16 | (2006.01) |
| H03F 1/42 | (2006.01) |
| H03F 3/195 | (2006.01) |
| H03F 3/45 | (2006.01) |

(52) U.S. Cl.
CPC .. *H03F 3/16* (2013.01); *H03F 1/42* (2013.01); *H03F 3/195* (2013.01); *H03F 3/45183* (2013.01); *H03F 2200/336* (2013.01); *H03F 2200/423* (2013.01); *H03F 2203/45631* (2013.01); *H03F 2203/45638* (2013.01); *H03F 2203/45702* (2013.01); *H03F 2203/45706* (2013.01)
USPC ............................................. 326/115; 326/83

(58) Field of Classification Search
None
See application file for complete search history.

(56) References Cited

U.S. PATENT DOCUMENTS

| | | | | |
|---|---|---|---|---|
| 5,196,805 | A * | 3/1993 | Beckwith et al. | 330/54 |
| 5,486,794 | A * | 1/1996 | Wu et al. | 331/115 |
| 5,936,458 | A * | 8/1999 | Rylov | 327/528 |
| 5,945,847 | A * | 8/1999 | Ransijn | 326/115 |
| 6,340,899 | B1 * | 1/2002 | Green | 326/115 |
| 6,417,737 | B1 * | 7/2002 | Moloudi et al. | 330/301 |
| 6,624,699 | B2 * | 9/2003 | Yin et al. | 330/260 |
| 6,836,185 | B1 * | 12/2004 | Pobanz | 330/260 |
| 7,145,390 | B2 * | 12/2006 | Pan | 330/261 |
| 7,170,349 | B2 * | 1/2007 | Bhattacharjee et al. | 330/254 |
| 7,256,646 | B2 * | 8/2007 | Eid et al. | 327/563 |
| 7,598,788 | B2 * | 10/2009 | Cao | 327/266 |
| 7,768,348 | B2 * | 8/2010 | Banba | 330/253 |
| 7,902,900 | B2 * | 3/2011 | Liu et al. | 327/307 |
| 2005/0093628 | A1 * | 5/2005 | Chen | 330/253 |
| 2005/0258873 | A1 * | 11/2005 | Green | 326/115 |
| 2005/0264356 | A1 * | 12/2005 | Kucharski et al. | 330/252 |
| 2008/0030266 | A1 * | 2/2008 | Liu et al. | 330/9 |

(Continued)

*Primary Examiner* — Crystal L Hammond
(74) *Attorney, Agent, or Firm* — Oblon, Spivak, McClelland, Maier & Neustadt, L.L.P.

(57) ABSTRACT

There is presented a high bandwidth circuit for high-speed transceivers. The circuit may comprise an amplifier combining capacitor splitting, inductance tree structures, and various bandwidth extension techniques such as shunt peaking, series peaking, and T-coil peaking to support data rates of 45 Gbs/s and above while reducing data jitter. The inductance elements of the inductance tree structures may also comprise high impedance transmission lines, simplifying implementation. Additionally, the readily identifiable metal structures of inductors and t-coils, the equal partitioning of the load capacitors, and the symmetrical inductance tree structures may simplify transceiver implementation for, but not limited to, a clock data recovery circuit.

20 Claims, 7 Drawing Sheets

(56) References Cited

U.S. PATENT DOCUMENTS

| | | | |
|---|---|---|---|
| 2008/0088374 A1* | 4/2008 | Hou et al. | 330/254 |
| 2009/0009244 A1* | 1/2009 | Banba | 330/253 |
| 2010/0211618 A1* | 8/2010 | Anderson et al. | 707/812 |
| 2012/0057606 A1* | 3/2012 | Cui et al. | 370/516 |
| 2012/0098572 A1* | 4/2012 | Tripathi et al. | 327/65 |

* cited by examiner

> US 8,928,355 B2

AMPLIFIER BANDWIDTH EXTENSION FOR HIGH-SPEED TRANCEIVERS

This application is a Continuation of U.S. application Ser. No. 13/166,592, filed Jun. 22, 2011, which is hereby incorporated by reference in its entirety.

BACKGROUND OF THE INVENTION

1. Field of the Invention

The present invention relates generally to data transmission. More particularly, the present invention relates to amplifier/buffer bandwidth extension for high-speed tranceivers.

2. Background Art

There is a continuous push in the art to provide higher bandwidth data links for fast and large volume data transfer. With the increased proliferation of digital data including images, video, and other data, the need to quickly transfer digital data from one location to another becomes increasingly important. For example, high-speed data links are necessary to send video signals to a display, to transfer data across networks, to archive data to disks, and to perform other tasks.

For high-speed tranceivers with data rates exceeding 45 Gbs/s, quarter rate architecture is often used to relax the speed constraints for critical decision circuits such as samplers and slicers. However, this architecture poses some implementation challenges. Specifically, to acquire four data bits and four edge bits to create an optimal sampling point for the clock data recovery (CDR), eight parallel samplers and slicers are needed. This heavy load poses difficulties in amplifier/buffer design, as conventional bandwidth extension techniques cannot provide sufficient gain and bandwidth boosting to meet the amplitude and jitter specifications required by the samplers and slicers.

Accordingly, there is a need to overcome the drawbacks and deficiencies in the art by providing an amplifier design suitable for high-speed transceivers with increasing data rate and heavier load.

SUMMARY OF THE INVENTION

There is provided a high bandwidth extension technique with a variety of applications, such as amplifier/buffer, drivers, comparators, multiplexers and others, substantially as shown in and/or described in connection with at least one of the figures, as set forth more completely in the claims.

BRIEF DESCRIPTION OF THE DRAWINGS

The features and advantages of the present invention will become more readily apparent to those ordinarily skilled in the art after reviewing the following detailed description and accompanying drawings, wherein.

DETAILED DESCRIPTION OF THE INVENTION

The present application is directed to a high bandwidth amplifier/buffer for high-speed transceivers such as with data rate exceeding 45 Gbs/s. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art. The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1A:
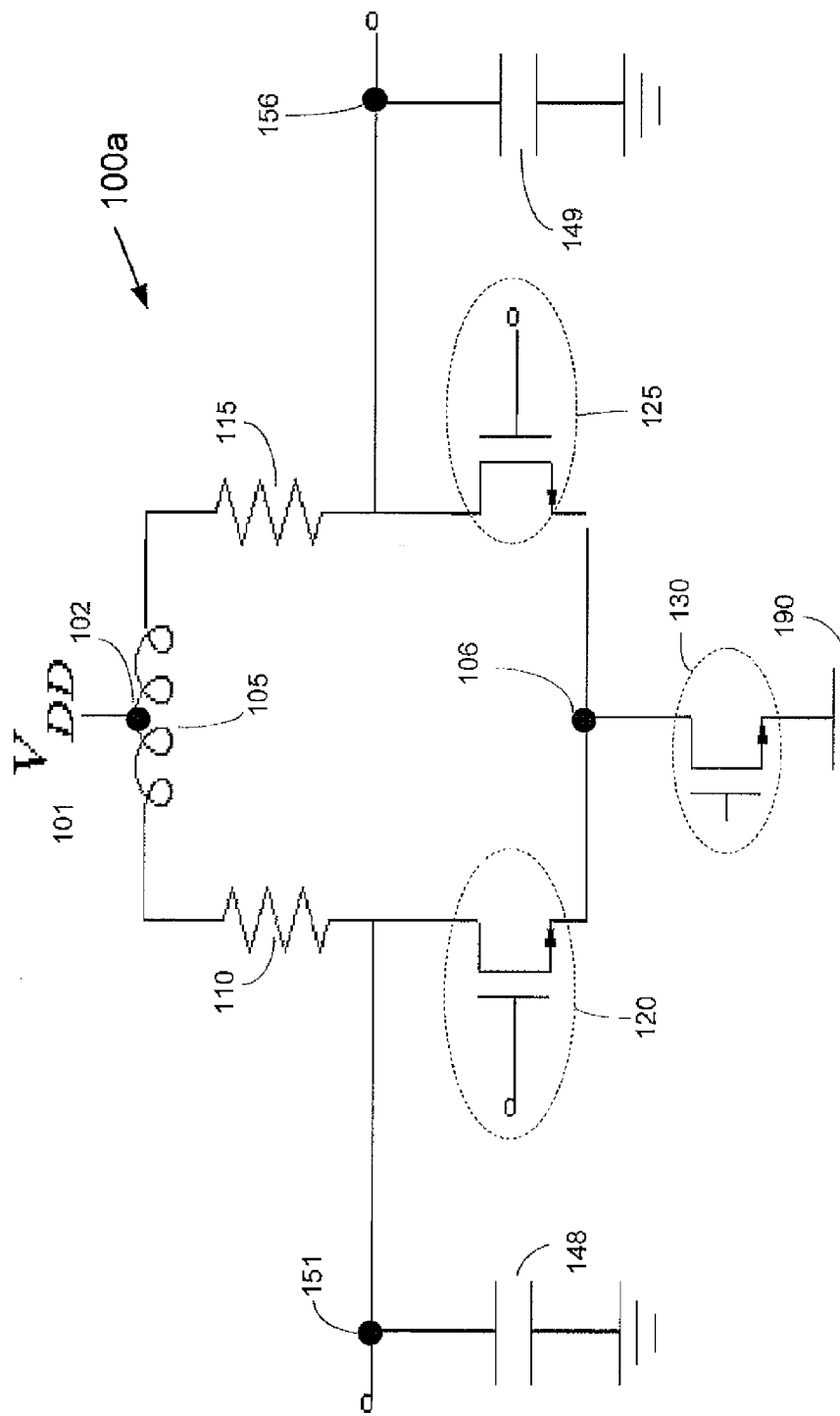
FIG. 1a presents a conventional amplifier/buffer circuit using shunt peaking for bandwidth extension.

FIG. 1a presents a conventional amplifier/buffer circuit, the amplifier using shunt peaking for bandwidth extension. Diagram 100a of FIG. 1a includes voltage supply 101, voltage supply point 102, shunt inductance element 105, connection point 106, resistor 110 and 115, transistor 120, 125, and 130, output point 151 and 156, load capacitor 148 and 149, and ground 190. Shunt inductance element 105 may comprise an inductor to implement shunt peaking. Transistor 120, 125, and 130 may each include a first terminal, a second terminal, and a third terminal, corresponding to a drain terminal, a source terminal, and a gate terminal, respectively. Capacitor 148 and 149 may include the device capacitance and parasitic capacitance presented by the amplifier/buffer load.

As shown in diagram 100a, shunt inductance element 105 is coupled with voltage supply point 102, which is connected to voltage supply 101. Shunt inductance element 105 is connected to resistor 110 and resistor 115. Resistor 110 is connected to first terminal of transistor 120. Resistor 110, transistor 120 and capacitor 148 are coupled to output point 151. Resistor 115 is connected to the first terminal of transistor 125. Resistor 115, transistor 125, and capacitor 149 are coupled to output point 156. Capacitors 148 and 149 are connected to ground 190. The second terminals of transistor 120 and 125 are coupled at connection point 106. The first terminal of transistor 130 is connected to connection point 106 and the second terminal of transistor 130 is connected to ground 190.

As the signal frequency increases, shunt inductance element 105 introduces a component that increases the impedance in the circuit, offsetting the decreased impedance caused by load capacitor 148 and 149. However, the inductance value of shunt inductance element 105 must be optimized to keep data jitter within manageable levels. As a result, the shunt peaking implemented in diagram 100a may only extend bandwidth by a factor of approximately one and a half (1.5) times.

Figure 1B:
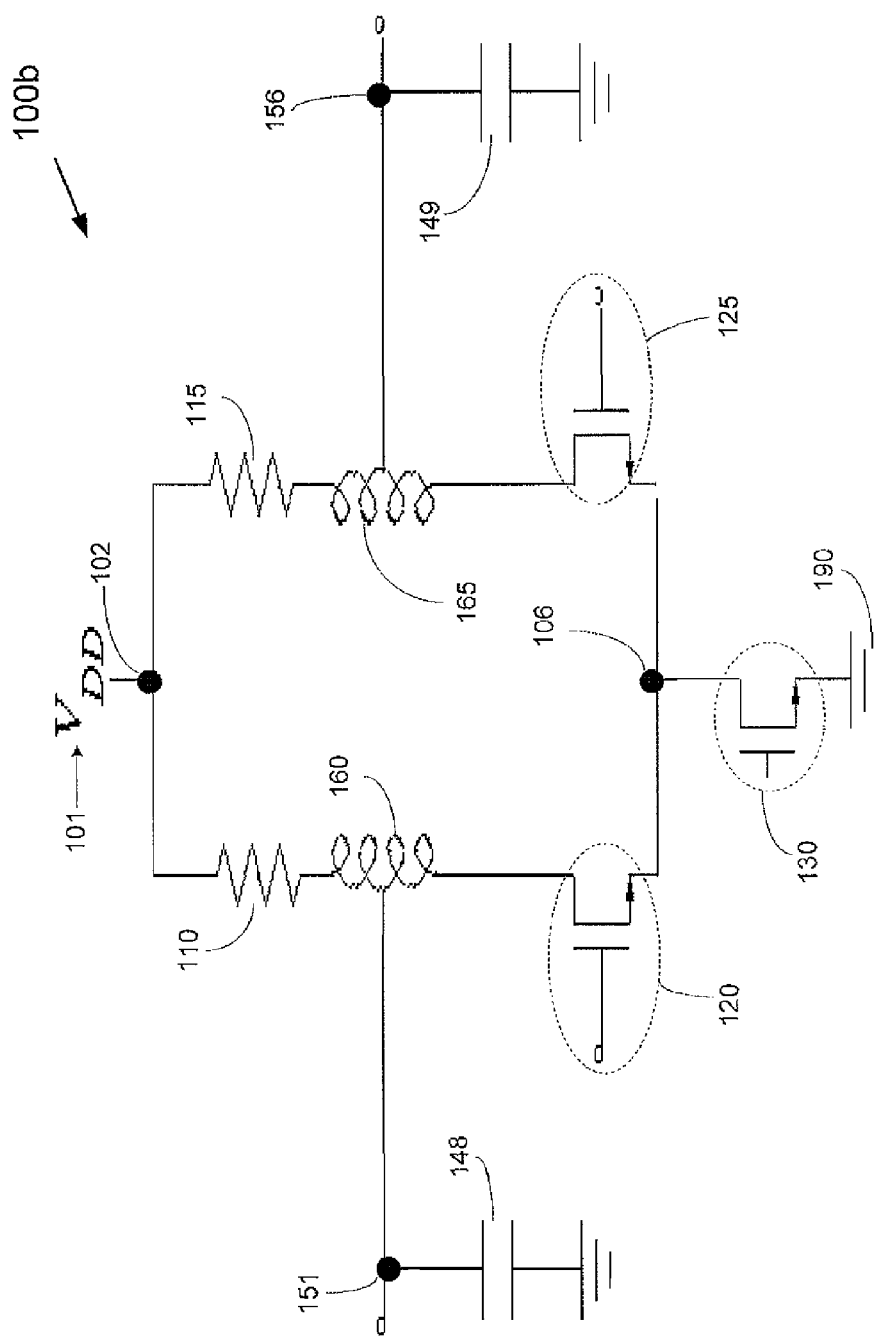
FIG. 1b presents a conventional amplifier/buffer circuit using t-coil peaking for bandwidth extension.

Moving to FIG. 1b, FIG. 1b presents a conventional amplifier circuit using t-coil peaking for bandwidth extension. Diagram 100b of FIG. 1b may correspond to diagram 100a of FIG. 1a, but with t-coil peaking utilized instead of shunt peaking. Diagram 100b of FIG. 1b includes voltage supply 101, voltage supply point 102, connection point 106, resistor 110 and 115, transistor 120, 125, and 130, output point 151 and 156, load capacitor 148 and 149, t-coil 160 and 165 and ground 190.

Comparing diagram 100a of FIG. 1a and diagram 100b of FIG. 1b, shunt inductance element 105 is removed and t-coil 160 and 165 are added. T-coil 160 and 165 may comprise inductors to implement t-coil peaking. T-coil 160 is coupled between resistor 110 and transistor 120. T-coil 160 and load capacitor 148 are coupled at output point 151. T-coil 165 is coupled between resistor 115 and transistor 125. T-coil 165 and load capacitor 149 are coupled at output point 156.

The t-coil peaking implemented in diagram 100b of FIG. 1b may theoretically extend bandwidth by a factor of 2.8 times. However, as with shunt peaking, data jitter concerns may limit practical bandwidth extension to a factor of approximately two (2) times.

Figure 1C:
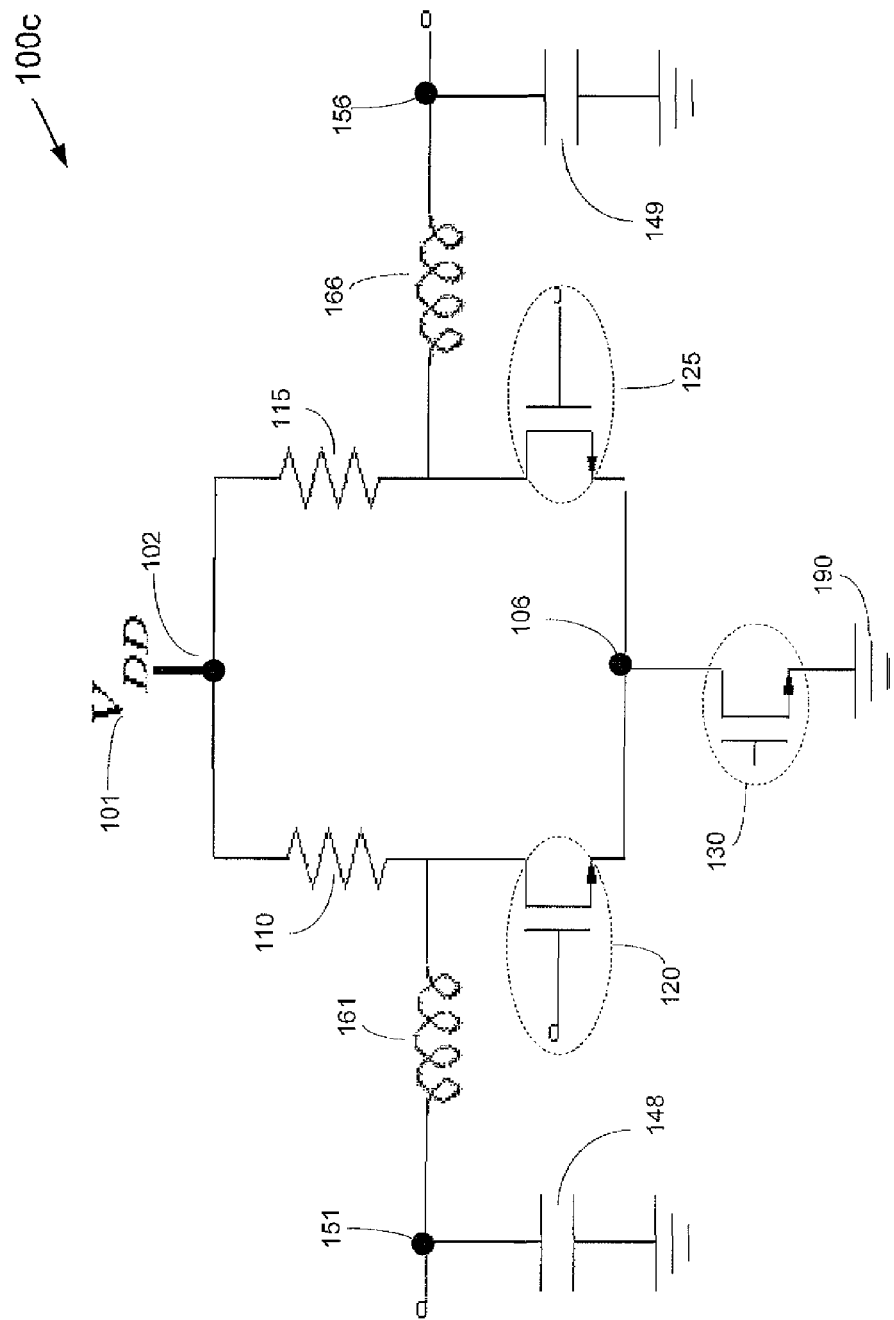
FIG. 1c presents a conventional amplifier/buffer circuit using series peaking for bandwidth extension.

Moving to FIG. 1c, FIG. 1c presents a conventional amplifier circuit using series peaking for bandwidth extension. Diagram 100c of FIG. 1c includes voltage supply 101, voltage supply point 102, connection point 106, output point 151 and 156, resistor 110 and 115, transistor 120, 125, and 130, load capacitor 148 and 149, inductance element 161 and 166 and ground 190.

Diagram 100c of FIG. 1c may correspond to diagram 100a of FIG. 1a, but with series peaking utilized instead of shunt peaking. Thus, inductance elements 161 and 166 are utilized instead of shunt inductance element 105. Inductance element 161 and 166 may comprise inductors connected in series to load capacitor 148 and 149, respectively. Inductance element 161 is coupled to resistor 110, transistor 120, and load capacitor 148. Likewise, inductance element 166 is coupled to resistor 115, transistor 125, and load capacitor 149.

As with shunt peaking and t-coil peaking, the series peaking implemented in diagram 100c of FIG. 1c may extend bandwidth by a factor of approximately 1.5 times. However, the low factors of bandwidth extension provided by shunt peaking, t-coil peaking, and series peaking may be insufficient for heavy load (large value load capacitor 148 and 149) at high-speed data rate, for example 45 Gbs/s.

Figure 2A:
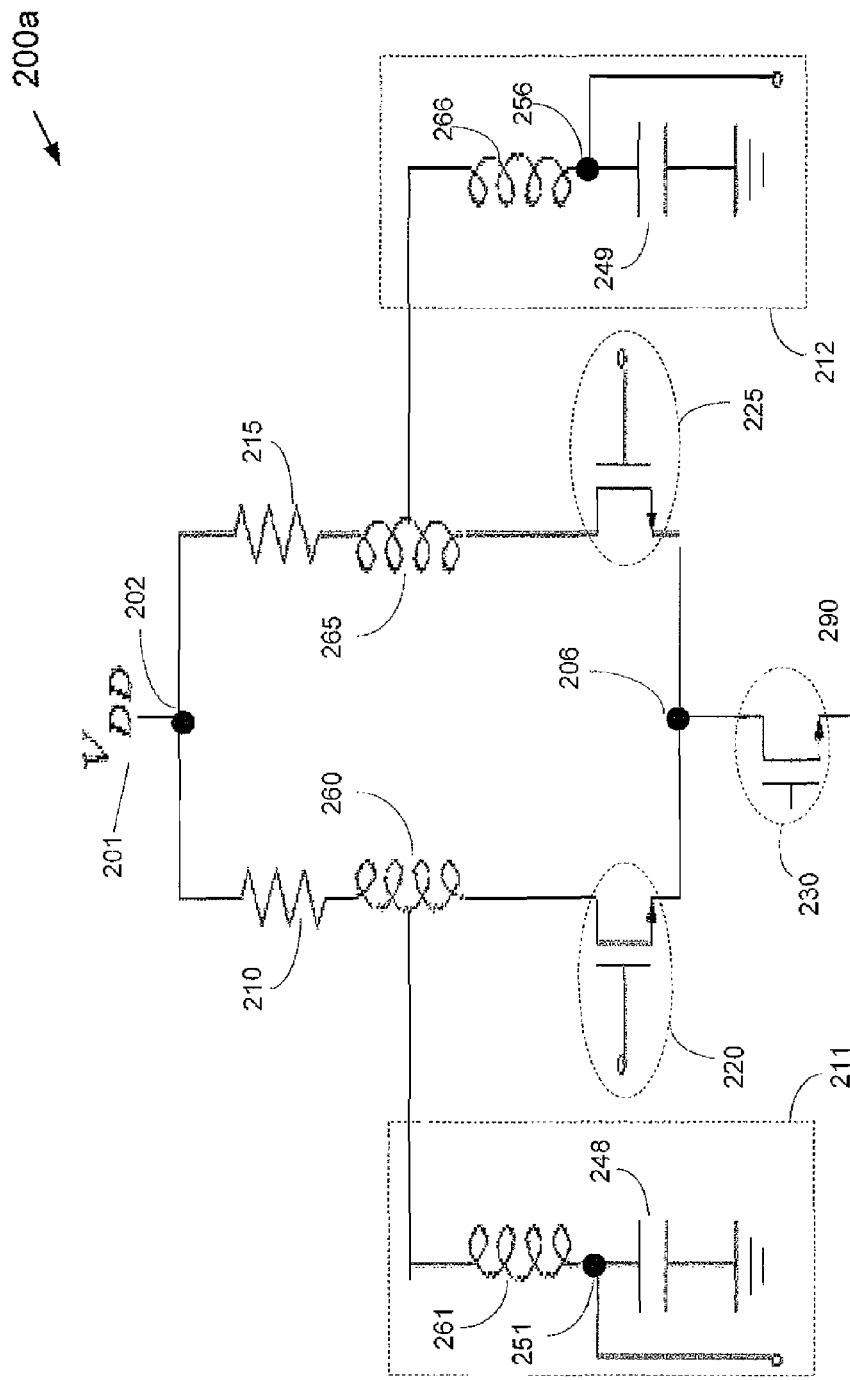
FIG. 2a presents a high bandwidth amplifier/buffer circuit according to one embodiment of the present invention, the amplifier using a t-coil structure and series peaking for bandwidth extension.

Accordingly, FIG. 2a presents a high bandwidth amplifier/buffer according to one embodiment of the present invention, the amplifier using a t-coil structure and series peaking for bandwidth extension. Diagram 200a of FIG. 2a includes voltage supply 201, voltage supply point 202, connection point 206, resistor 210 and 215, t-coil 260 and 265, transistor 220, 225, and 230, ground 290, a first portion 211 and a second portion 212. Portion 211 includes inductance element 261, capacitor 248, and output point 251. Portion 212 includes inductance element 266, capacitor 249, and output point 256.

With respect to FIG. 2a, voltage supply 201, voltage supply point 202, connection point 206, resistor 210 and 215, load capacitor 248 and 249, transistor 220, 225, and 230, output point 251 and 256, and ground 290 may each correspond, respectively, to voltage supply 101, voltage supply point 102, connection point 106, resistor 110 and 115, capacitor 148 and 149, transistor 120, 125, and 130, output point 151 and 156, and ground 190 of FIG. 1a. T-coil 260 and 265 may correspond to t-coil 160 and 165 in FIG. 1b and inductance element 261 and 266 may correspond to inductance element 161 and 166 in FIG. 1c.

Diagram 200a of FIG. 2a may comprise a combination of t-coil peaking shown in diagram 100b of FIG. 1b and series peaking shown in diagram 100c of FIG. 1c. Portion 211 is coupled to ground 290 and T-coil 260. Likewise, portion 212 is coupled to ground 290 and T-coil 265. Thus, both t-coil 260 and 265 and inductance elements 261 and 266 are utilized.

While the amplifier embodiment shown in diagram 200a of FIG. 2a may extend bandwidth beyond that of conventional amplifiers as shown in FIGS. 1a-1c, greater bandwidth extension may be achieved by using a capacitor splitting technique, as described below.

Figure 2B:
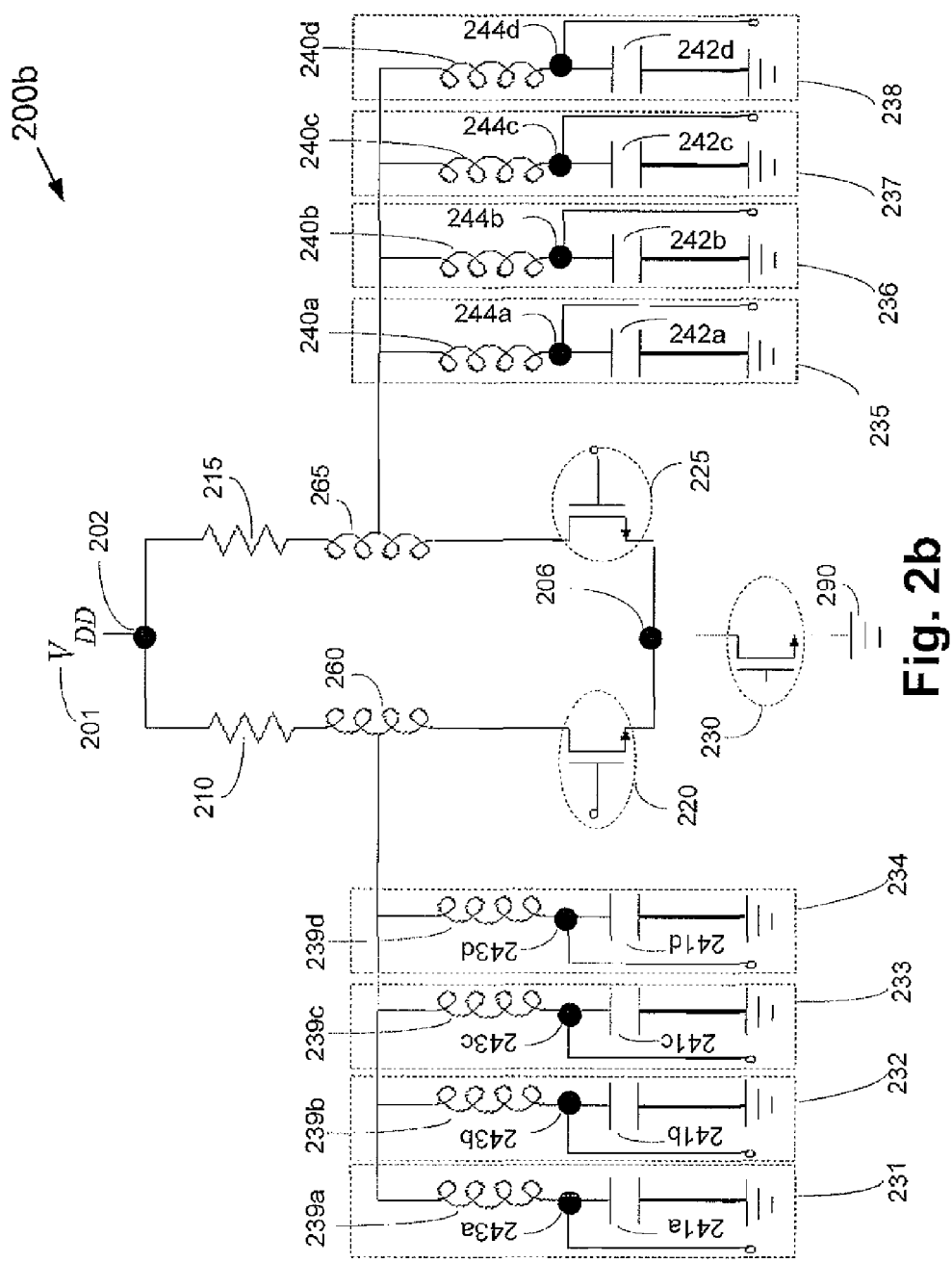
FIG. 2b presents a high bandwidth amplifier/buffer circuit according to one embodiment of the present invention, the amplifier using a t-coil structure, capacitor splitting, and series inductance compensation for bandwidth extension.

FIG. 2b presents a high bandwidth amplifier/buffer according to one embodiment of the present invention, the amplifier using a t-coil structure, capacitor splitting, and series inductance compensation for bandwidth extension. Diagram 200b of FIG. 2b includes voltage supply 201, voltage supply point 202, connection point 206, resistor 210 and 215, t-coil 260 and 265, transistor 220, 225, and 230, ground 290, and a plurality of portions including portions 231, 232, 233, 234, 235, 236, 237 and 238. A first plurality of portions, or portions 231-234 each respectively include one of inductance element 239a-239d, load capacitor 241a-241d, and output point 243a-243d. A second plurality of portions, or portions 235-238 each respectively include one of inductance element 240a-240d, load capacitor 242a-242d, and output point 244a-244d.

With respect to FIG. 2b, voltage supply 201, voltage supply point 202, connection point 206, resistor 210 and 215, t-coil 260 and 265, transistor 220, 225, and 230, and ground 290 may correspond to voltage supply 101, voltage supply point 102, connection point 106, resistor 110 and 115, t-coil 160 and 165, transistor 120, 125, and 130, ground 190 in diagram 100b of FIG. 1b, respectively.

Comparing diagram 200b of FIG. 2b with diagram 200a of FIG. 2a, it can be observed that portion 211 is split into portions 231-234, and portion 212 is split into portions 235-238. Thus, each of the load capacitor 248 and 249 may be split or divided into load capacitors 241a-241d and 242a-242d, respectively, thereby providing a split load rather than a single large capacitance load. Portions 231-234 are coupled to t-coil 260, and portions 235-238 are coupled to t-coil 265. As shown in diagram 200b of FIG. 2b, each of portions 231-238 may be constructed similarly as portion 211 and 212 in diagram 200a of FIG. 2a.

Furthermore, while diagram 200b of FIG. 2b presents an embodiment combining capacitor splitting and t-coil peaking, various alternative embodiments combining different bandwidth extension techniques may also be utilized. For example, shunt peaking may be combined with capacitor splitting for further bandwidth extension, but in a preferred embodiment, t-coil peaking may be combined with series peaking and capacitor splitting, as shown in diagram 200b of FIG. 2b.

Load capacitors 241a-241d may have a total capacitance equal to the capacitance of load capacitor 248 of FIG. 2a, and load capacitor 242a-242d may have a total capacitance equal to the capacitance of load capacitor 249 of FIG. 2a. Moreover, each of load capacitor 241a-241d and 242a-242d may also have equal capacitance values, providing equal parts. Inductance element 239a-239d and 240a-240d may be used to offset load capacitor 241a-241d and 242a-242d, respectively. Since each of load capacitor 241a-241d and 242a-242d may have equal capacitance values, each of inductance element 239a-239d and 240a-240d may have equal inductance values. In alternative embodiments, each of load capacitor 241a-241d and 242a-242d may have different capacitance values, resulting in each inductance element 239a-239d and 240a-

240d having different corresponding inductance values to offset or compensate for the different capacitance values.

As shown in diagram 200b of FIG. 2b, the first and second plurality of portions may form a mirror image. More specifically, a composition of the first plurality of portions, or portions 231-234, may be equivalent to a composition of the second plurality of portions, or portions 235-238. While the embodiment shown in diagram 200b of FIG. 2b splits the capacitors into a first plurality of portions numbering four and a second plurality of portions numbering four for a total count of eight portions, alternative embodiments may use any number of equivalent first and second plurality of portions.

At high data rates such as 45 gigabits per second (Gbs/s) and above, each of inductance element 239a-239d and 240a-240d may comprise a high impedance transmission line rather than a discrete inductor. Thus, the high impedance transmission lines are equivalent to inductance components, absorbing the parasitic capacitance from the metal structure as well as from the amplifier device itself.

The amplifier circuit in diagram 200b of FIG. 2b may achieve bandwidth extension by a factor of more than four to five times, while at the same time maintaining a sub-ps data jitter range for optimized performance at the next stage, for example, but not limited to, high-speed tranceiver of a clock data recovery circuit. As load capacitance increases and data rate increases, the first and second portions may be split into a larger number of portions to further extend bandwidth for data transmission through additional output points. However, to provide even greater bandwidth extension, an inductance tree structure may be further utilized, as discussed below.

Figure 2C:
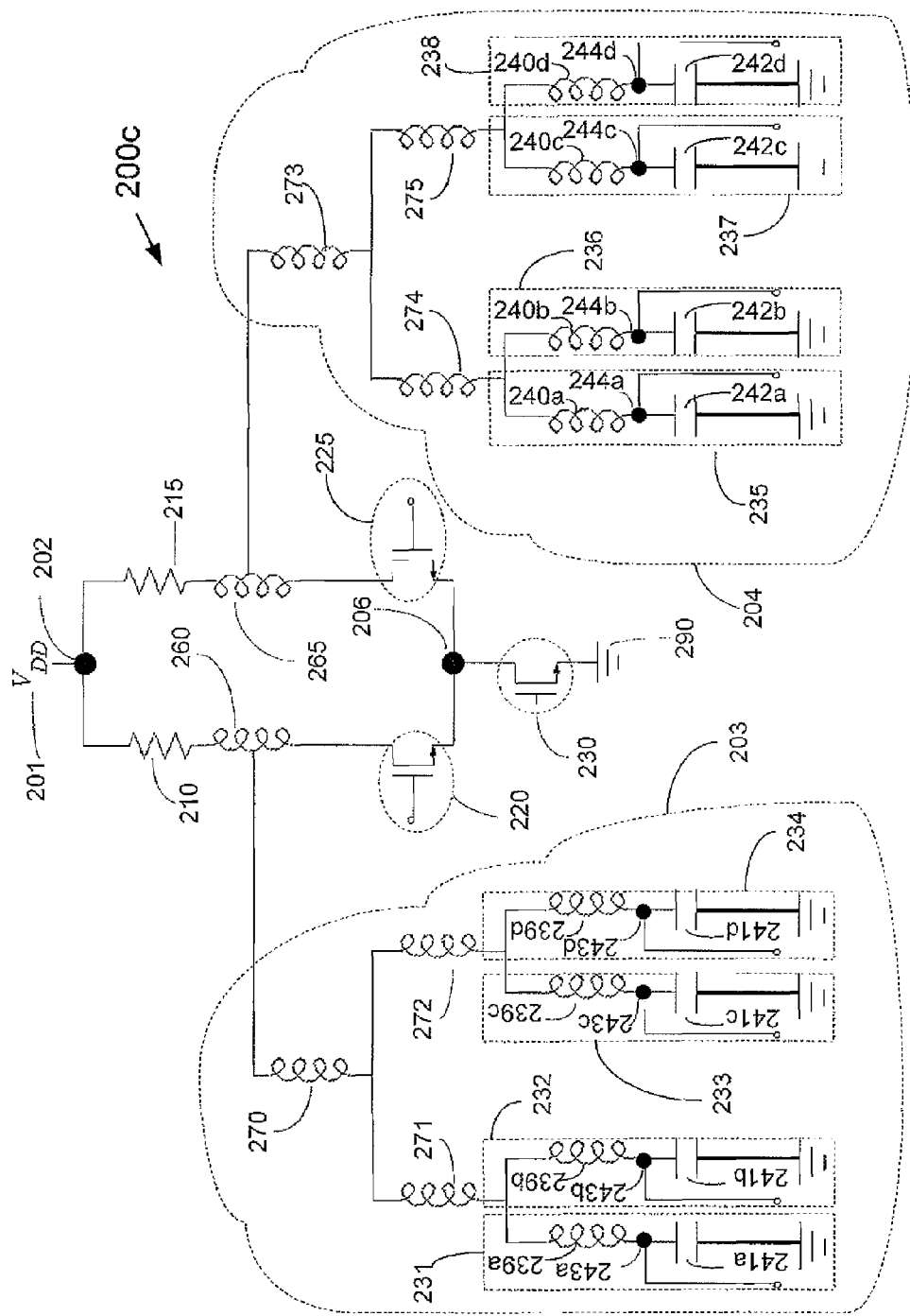
FIG. 2c presents a high bandwidth amplifier/buffer circuit according to one embodiment of the present invention, the amplifier using a t-coil structure, capacitor splitting, and an inductance tree structure for bandwidth extension.

FIG. 2c presents a high bandwidth amplifier/buffer circuit according to one embodiment of the present invention, the amplifier using a t-coil structure, capacitor splitting, and an inductance tree structure for bandwidth extension. Diagram 200c of FIG. 2c includes voltage supply 201, voltage supply point 202, resistor 210 and 215, t-coil 260 and 265, connection point 206, transistor 220, 225, and 230, and perfect binary tree structure 203 and 204. Perfect binary tree structure 203 includes inductance element 270-272 and portion 231-234. Perfect binary tree structure 204 includes inductance element 273-275 and portions 235-238. The composition of portions 231-238 is similar to portions 231-238 as described in FIG. 2b.

With respect to FIG. 2c, voltage supply 201, voltage supply point 202, resistor 210 and 215, t-coil 260 and 265, connection point 206, and transistor 220, 225, and 230 may correspond to voltage supply 101, voltage supply point 102, resistor 110 and 115, t-coil 160 and 165, connection point 106, transistor 120, 125, and 130 of FIG. 1b.

Diagram 200c of FIG. 2c may comprise the circuit of diagram 200b of FIG. 2b with portions 231-234 integrated into a first perfect binary tree structure 203 and portions 235-238 integrated into a second perfect binary tree structure 204. Thus, the first plurality of portions, or portions 231-234, comprise a first plurality of leaf nodes of the first binary tree structure, and the second plurality of portions, or portions 235-238, comprise a second plurality of leaf nodes of the second perfect binary tree structure. The root nodes of the first and second perfect binary tree structures 203 and 204, or inductance elements 270 and 273, may be connected to t-coil 260 and 265, respectively.

The first and second perfect binary tree structures 203 and 204 have the properties of a perfect binary tree, as known in the art. Thus, it can be seen that for perfect binary tree structure 203, inductance element 270 corresponds to the root node, inductance elements 271 and 272 correspond to child nodes of the root node, portions 231 and 232 correspond to leaf nodes with a parent inductance element 271, and portions 233 and 234 correspond to leaf nodes with a parent inductance element 272. Second perfect binary tree structure 204 is constructed in a similar manner, as shown in diagram 200c of FIG. 2c.

Similar to FIG. 2b, the first and second perfect binary tree structures 203 and 204 may comprise mirror images of each other, and may therefore be equivalent in composition. Additionally, while diagram 200c of FIG. 2c shows tree structures with a height of two, alternative embodiments may use tree structures with any height. Compared to the single level structure shown in diagram 200b of FIG. 2b, the multi-level inductance tree structure utilized in diagram 200c of FIG. 2c may further extend data bandwidth while minimizing data jitter.

Figure 2D:
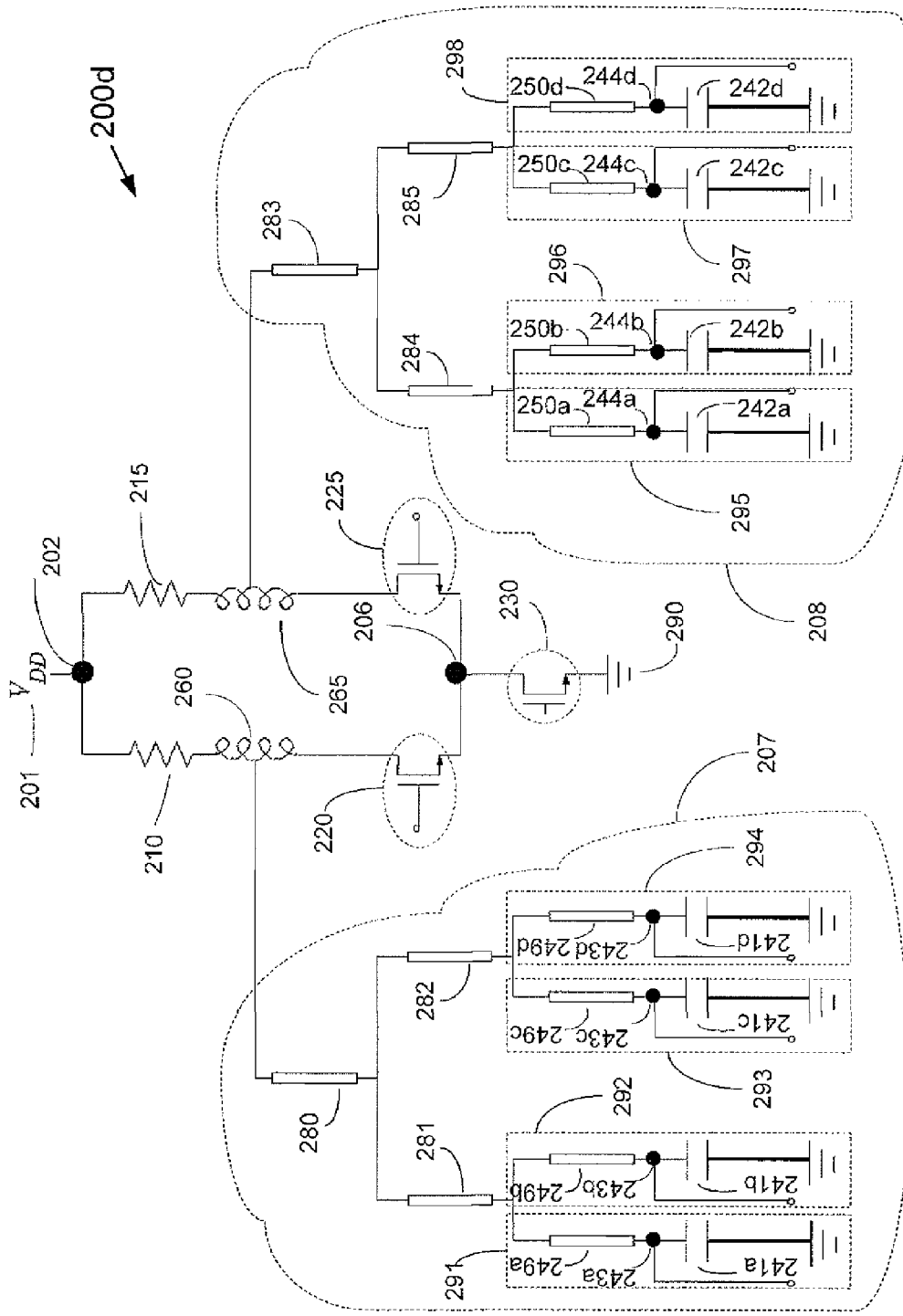
FIG. 2d presents a high bandwidth amplifier/buffer circuit according to one embodiment of the present invention, the amplifier using a t-coil structure, capacitor splitting, and a high impedance transmission line tree structure.

Moving to FIG. 2d, FIG. 2d presents a high bandwidth amplifier/buffer circuit according to one embodiment of the present invention, the amplifier using a t-coil structure, capacitor splitting, and a high impedance transmission line tree structure. Diagram 200d of FIG. 2d includes voltage supply 201, voltage supply point 202, resistor 210 and 215, t-coil 260 and 265, transistor 220, 225, and 230, connection point 206, and perfect binary tree structure 207 and 208. Perfect binary tree structure 207 includes high impedance transmission line 280-282 and portions 291-294. Perfect binary tree structure 208 includes high impedance line 283-285 and portion 295-298.

With respect to FIG. 2d, voltage supply 201, voltage supply point 202, resistor 210 and 215, t-coil 260 and 265, transistor 220, 225, and 230, connection point 206 may correspond to voltage supply 101, voltage supply point 102, resistor 110 and 115, t-coil 160 and 165, transistor 120, 125, and 130, connection point 106 of diagram 100b of FIG. 1b.

Diagram 200d of FIG. 2d may comprise the circuit of diagram 200c in FIG. 2c with the inductance elements of perfect binary tree structure 203 and 204 comprising high impedance transmission lines. As previously discussed in FIG. 2b, at high data rates of 45 Gbs/s or higher, it is possible to replace the discrete inductance elements with high impedance transmission lines.

Thus, inductance element 270-275, 239a-239d and 240a-240d of FIG. 2c comprise high impedance transmission lines 280-285, 249a-249d, and 250a-250d, respectively, forming perfect binary tree structures 207 and 208. Since discrete inductance elements are not required, it becomes easier to implement the circuit in diagram 200d of FIG. 2d compared to the circuit in diagram 200c of FIG. 2c.

Thus, several high bandwidth amplifier designs for high-speed transceivers have been disclosed. By splitting the load capacitor into several equal parts, data bandwidth may be extended well beyond 45 Gbs/s. Further, by combining various bandwidth extension techniques such as t-coil peaking, shunt peaking, and series peaking, bandwidth may be further extended. Moreover, since the inductor and t-coil structures are easily identifiable, the capacitor splitting provides equal parts, and the inductance trees provide symmetrical structures, data identification at the next stage is advantageously simplified. Furthermore, while the disclosed examples have focused on data buffer amplifier circuit designs, a similar technique may also be applied to other circuit design structures such as high-speed multiplexers and high-speed samplers and slicers. Thus, the disclosed circuit is not limited to data buffer amplifier circuits and may also be utilized for a variety of high-speed transceiver applications.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangement, modifications, and substitutions without departing from the scope of the invention.

What is claimed is:

1. An amplifier comprising:
   a voltage supply connected to a first t-coil and a second t-coil;
   a plurality of output points comprising a first portion of plural output points and a second portion of plural output points, wherein each of the plurality of output points is disposed at a connection point between a respective inductor and a respective load capacitor;
   the first t-coil connected to each of the first portion of output points by the respective inductors and the second t-coil connected to each of the second portion of output points by the respective inductors.

2. The amplifier of claim 1 further comprising a first resistor connecting the first t-coil to the voltage supply and a second resistor connecting the second t-coil to the voltage supply.

3. The amplifier of claim 1, wherein a count of the plurality of output points is eight.

4. The amplifier of claim 1, wherein each of the respective load capacitors has the same load capacitance value.

5. The amplifier of claim 1, wherein one or more of the respective inductors is a high impedance transmission line.

6. The amplifier of claim 1, wherein each of the respective load capacitors is connected to ground.

7. The amplifier of claim 1 further comprising:
   a first perfect binary tree structure comprising at least the first portion of plural output points; and
   a second perfect binary tree structure comprising at least the second portion of plural output points.

8. The amplifier of claim 7, wherein the first perfect binary tree structure is a mirror image of the second perfect binary tree structure.

9. The amplifier of claim 8, wherein a height of the first perfect binary tree structure and a height of the second perfect binary tree structure is two or more.

10. The amplifier of claim 1, wherein a bandwidth at the plurality of output points is at least 45 gigabits per second.

11. The amplifier of claim 1 further comprising:
    a first transistor having a first terminal connected to the first t-coil;
    a second transistor having a first terminal connected to the second t-coil;
    a third transistor having a first terminal connected to a second terminal of each of the first transistor and the second transistor.

12. The amplifier of claim 11, wherein a second terminal of the third transistor is connected to ground.

13. An amplifier comprising:
    a voltage supply connected to a first t-coil and a second t-coil;
    a first perfect binary tree structure comprising a first root node connected to the first t-coil and a first plurality of leaf nodes;
    a second perfect binary tree structure comprising a second root node connected to the second t-coil and a second plurality of leaf nodes;
    wherein each of the first plurality of leaf nodes and each of the second plurality of leaf nodes comprises an output point disposed at a connection point between a respective inductor and a respective load capacitor.

14. The amplifier of claim 13 further comprising a first resistor connecting the first t-coil to the voltage supply and a second resistor connecting the second t-coil to the voltage supply.

15. The amplifier of claim 13, wherein one or more of the respective inductors is a high impedance transmission line.

16. The amplifier of claim 13, wherein each of the respective load capacitors are connected to ground.

17. The amplifier of claim 13, wherein the first perfect binary tree structure is a mirror image of the second perfect binary tree structure.

18. The amplifier of claim 13, wherein a height of the first perfect binary tree structure and a height of the second perfect binary tree structure is two or more.

19. The amplifier of claim 13 further comprising:
    a first transistor having a first terminal connected to the first t-coil;
    a second transistor having a first terminal connected to the second t-coil;
    a third transistor having a first terminal connected to a second terminal of each of the first transistor and the second transistor.

20. The amplifier of claim 19, wherein a second terminal of the third transistor is connected to ground.

* * * * *